United States Patent
Gayrard et al.

(10) Patent No.: US 9,413,482 B2
(45) Date of Patent: Aug. 9, 2016

(54) METHOD FOR TRANSMITTING AND METHOD FOR RECEIVING A BINARY DATA STREAM, TRANSMITTER AND RECEIVER FOR CARRYING OUT THE METHOD

(71) Applicant: THALES, Neuilly-sur-Seine (FR)

(72) Inventors: Jean-Didier Gayrard, Cugnaux (FR); Arnaud Le Kernec, Toulouse (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/516,398

(22) Filed: Oct. 16, 2014

(65) Prior Publication Data

US 2015/0110491 A1 Apr. 23, 2015

(30) Foreign Application Priority Data

Oct. 18, 2013 (FR) ...................................... 13 02417

(51) Int. Cl.
*H04B 10/50* (2013.01)
*H04J 14/02* (2006.01)
*H03M 13/29* (2006.01)
*H04L 1/00* (2006.01)

(52) U.S. Cl.
CPC ........... *H04J 14/02* (2013.01); *H03M 13/2906* (2013.01); *H04B 10/506* (2013.01); *H04J 14/0279* (2013.01); *H04L 1/0065* (2013.01)

(58) Field of Classification Search
CPC ............................ H04B 10/506; H04J 14/0257
See application file for complete search history.

(56) References Cited

U.S. PATENT DOCUMENTS

| | | | |
|---|---|---|---|
| 6,433,904 B1 | 8/2002 | Swanson et al. | |
| 6,731,878 B1 * | 5/2004 | Britz | H04B 10/1121 398/118 |
| 7,277,644 B2 * | 10/2007 | Johnson | H03M 13/1515 398/118 |
| 2003/0021355 A1 | 1/2003 | You | |
| 2003/0215176 A1 * | 11/2003 | Britz | G02B 6/2938 385/24 |
| 2012/0257902 A1 * | 10/2012 | Deng | H04B 10/506 398/152 |
| 2013/0216221 A1 | 8/2013 | Zhang et al. | |
| 2014/0068385 A1 * | 3/2014 | Zhang | H03M 13/29 714/776 |

OTHER PUBLICATIONS

Ming-Seng Kao, et al., "A Product-Coded WDM Coding System", IEEE Transcations on Communications, Jan. 1996, pp. 43-46, vol. 44, No. 1, IEEE Service Center, Piscataway, NJ, USA, XP011008631.

* cited by examiner

*Primary Examiner* — Nathan Curs

(74) *Attorney, Agent, or Firm* — Baker & Hostetler LLP

(57) ABSTRACT

A transmitter of a binary data stream comprises: a serial/parallel converter to split the binary data stream into m different parallel bit streams, each bit stream having a rate D/m which is m times lower than the initial rate D; m first encoding modules to error-correcting encode each bit stream individually; a time-interleaver to intermix the information bits originating from different encoded bit streams; an encoder to error-correcting encode the m interleaved bit streams into p bit streams; p electro-optical modulators to modulate each of the p bit streams delivered by the interleaver by means of p optical carriers of different wavelengths; and a wavelength-division multiplexer to combine the less p optical carriers into a single optical signal.

4 Claims, 5 Drawing Sheets

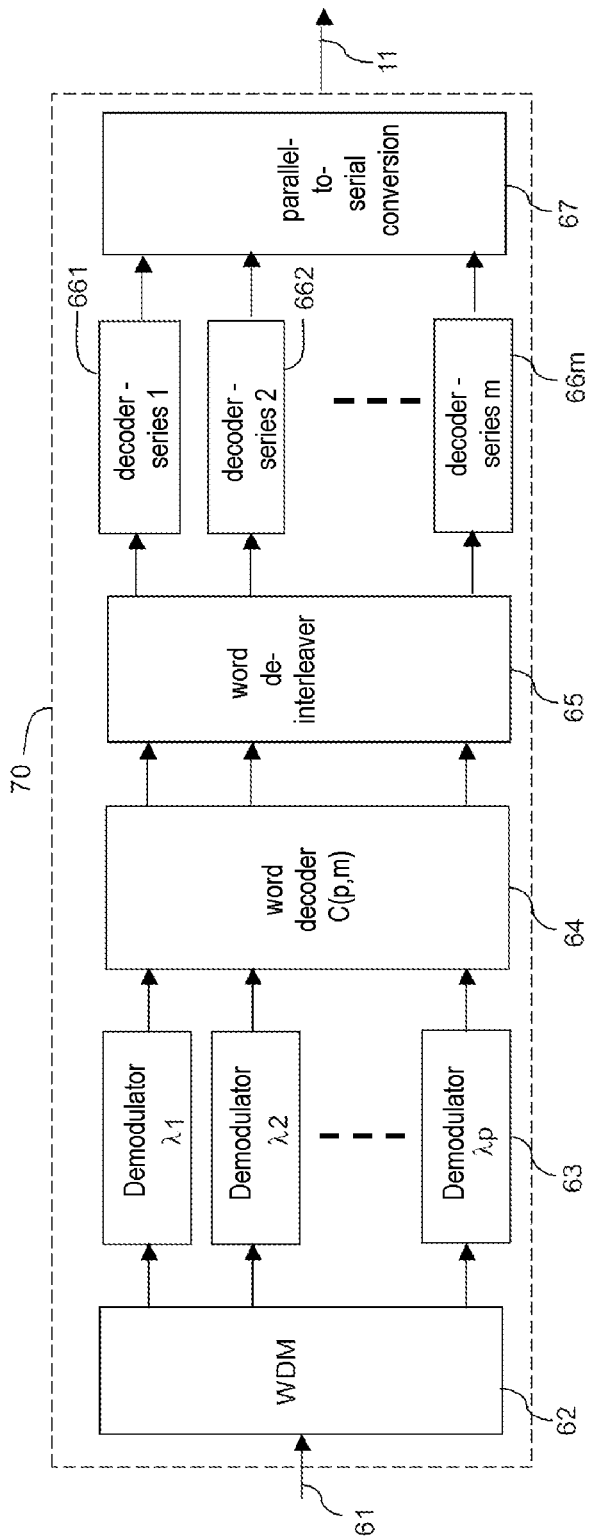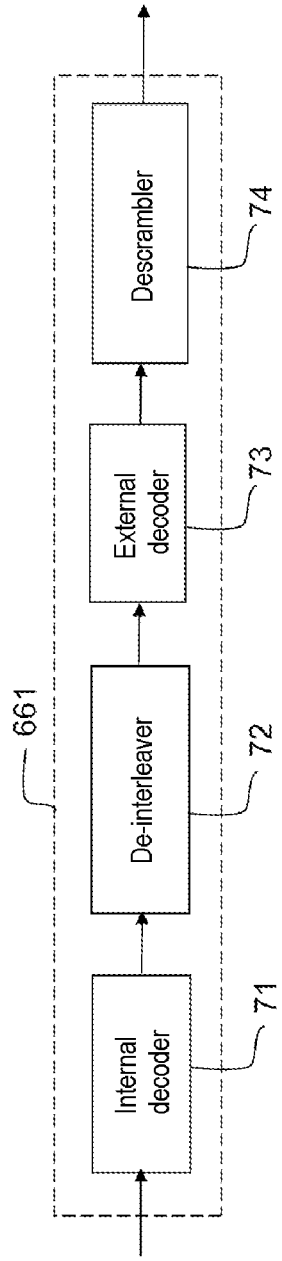

METHOD FOR TRANSMITTING AND METHOD FOR RECEIVING A BINARY DATA STREAM, TRANSMITTER AND RECEIVER FOR CARRYING OUT THE METHOD

CROSS-REFERENCE TO RELATED APPLICATION

This application claims priority to foreign French patent application No. FR 1302417, filed on Oct. 18, 2013, the disclosure of which is incorporated by reference in its entirety.

FIELD OF THE INVENTION

The present invention relates to a method for transmitting and a method for receiving a binary data stream, and also a transmitter and a receiver for carrying out the method. It applies to the field of telecommunications between a plurality of satellites or between one satellite and the earth and, in particular, to the digital optical links in free space from space to the earth, typically payload telemetry or image telemetry links corresponding to the transmission of images between a low earth orbit (LEO) observation satellite and an earth station.

BACKGROUND

Digital optical telecommunication links between a plurality of satellites or between one satellite and operational or experimental earth stations conventionally use technologies operating at a wavelength of 0.8 µm or 1.06 µm for the optical communication signal. These links use a single modulated and encoded optical carrier to transmit the digital data at a medium rate or at a high rate, these rates being able to be in the region of several tens of Mbps (Megabits per second) to several Gbps (Gigabits per second) according to the technology used. On transmission, the optical carrier is transmitted by a laser beam telescope, the wavefront of which is plane on entry into the atmosphere. However, the passage through turbulences in the atmosphere, in the case of a link between a satellite and an earth station, causes distortions in the wavefront of the laser beam. These distortions cause three phenomena in the telescope on reception. The first phenomenon, called scintillation, is a variation in the energy received on the pupil of the telescope. The second phenomenon is the random displacement of the laser beam ("beam wander") which causes a variation in the angle of arrival of the laser beam on the pupil of the telescope, more or less effectively compensated by the fine pointing system of the telescope. The third phenomenon is the phase and amplitude variation of the optical signal ("wavefront error") on the surface of the pupil of the telescope which causes aberrations in the focal plane of the telescope which renders the coupling between the focus of the telescope and the input optical fibre of the receiver less effective. These three phenomena combine with one another to produce rapid and random variations in the optical signal level in the receiver input optical fibre. These power level variations manifest themselves as periods during which the signal is very weak and can no longer be detected and demodulated by the receiver. These periods are periods of fading of the digital optical link, these fading periods being both long, for example their duration is in the region of several hundreds of milliseconds, and deep, for example greater than minus ten decibels. During each fading period, the transmission of the binary data is interrupted, causing errors over a plurality of bits or an erasure of the data.

In order to correct these transmission errors, it is known to use error-correcting codes, however, the error-correcting codes can only correct individual, isolated errors and cannot correct long sequences of consecutive errors.

Resistance to the fading of the signal transmitted on the digital optical link can be obtained by time-interleaving of the binary data in such a way as to distribute the errors in time. This time-interleaving is applied in addition to the error-correcting codes, thereby ensuring the integrity of the transmitted data.

An interleaver is a device that splits up long periods of errors which have occurred during the signal attenuation period and which have been generated by the internal decoder, by distributing these errors in time in such a way that these errors can easily be corrected by the error-correcting code. Different types of interleaving exist, such as block interleavers, convolutional interleavers, random interleavers.

The duration of the time-interleaving must be of the same order of magnitude as the duration of the fading of the optical link. The duration of the fading being in the order of several hundreds of milliseconds (ms), to implement an optical link with a high data transmission rate, said rate being between several tens and several hundreds of Gbps, the implementation of the interleaving and encoding is difficult, or even impossible, with current digital electronics technologies. In particular, the memory sizes of known interleavers are insufficient to be able to store the data during long periods, and the processing rates of the encoders and decoders are too slow.

In order to increase the transmission rates, it is known to use a technology operating in the infrared band in wavelengths around 1550 nm. Document U.S. Pat. No. 7,277,644 describes an error-correcting method for optical transmission in free space operating in the infrared band around the 1550 nm (nanometer) wavelength. The method consists in copying the same binary signal incoming on a plurality of parallel channels and in transmitting the different copies on a plurality of optical links of different carriers and in selecting only the validated optical links in order to average the effects due to the scintillation phenomenon. However, the processing of the binary data on each link is carried out at the same rate as the incoming signal data, which does not allow the rate of processing of the binary data by the encoders and the interleavers to be reduced, the data at a very high rate above several Gbps to be processed, or the problem of scintillations with a duration greater than around ten milliseconds to be solved. Furthermore, this method, which uses the principle of redundancy of the data which are copied and processed on a plurality of parallel links, has the disadvantage of being costly in terms of power, since it requires the same information to be processed at the same rate as many times as there are different optical links.

SUMMARY OF THE INVENTION

The object of the invention is to overcome the disadvantages of the known methods and to carry out a method for transmitting and a method for receiving a binary data stream, and also a transmitter and a receiver for carrying out the method, being able to operate at a very high rate, between several Gbps and several hundred Gbps, not requiring the same information to be copied and processed a plurality of times, and being able to resist the scintillation phenomenon and correct errors due to fading lasting several seconds.

To do this, the invention relates to a method for transmitting a binary data stream having a predetermined initial rate D, consisting, sequentially, in a first preliminary step, in splitting the binary data stream into m different bit streams at a rate which is m times lower than the initial rate D, where m is an integer greater than 1, the m bit streams containing different information bit sequences, in a second step, in implementing a first individual error-correcting encoding of each of the m bit streams, the first individual encoding of each bit stream comprising successively a first encoding, followed by an interleaving, followed by a second encoding, in a third step, in time-interleaving the m encoded bit streams with one another in order to mix the information bits originating from different encoded bit streams, and in implementing an error-correcting encoding of the m interleaved bit streams into p different interleaved and encoded bit streams, where p is an integer greater than or equal to m, in a fourth step, in modulating each of the p interleaved and encoded bit streams by means of p optical carriers with different wavelengths in order to obtain p different optical signals, in a fifth step, in wavelength-division-multiplexing the p optical signals in order to obtain a multiplexed optical signal suitable for being transmitted in a sixth step on an optical link.

The invention also relates to a method for receiving a binary data stream transmitted by the transmission method, consisting in wavelength-division-demultiplexing a received optical signal in order to restore p optical carriers with different wavelengths, in demodulating each of the p optical carriers in order to restore p interlaced and encoded bit streams, in de-interleaving and error-correcting decoding the p bit streams in order to restore m encoded bit streams, in individually error-correcting decoding each of the m bit streams in order to restore m different bit streams at a rate D/m, and in converting the m bit streams into a binary data stream corresponding to the transmitted binary data stream.

The invention also relates to a transmitter of a binary data stream having a predetermined initial rate D, comprising, sequentially, a serial/parallel converter to split the binary data stream into m different parallel bit streams, each bit stream having a rate D/m which is m times lower than the initial rate D, where m is an integer greater than 1, m first encoding modules dedicated to each bit stream in order to error-correcting encode individually each bit stream, each first encoding module comprising successively a first encoder, followed by an interleaver, followed by a second encoder, a time-interleaver with m inputs and m outputs to intermix the information bits originating from the different individually encoded bit streams, an encoder with m inputs and p outputs to error-correcting encode the m interlaced bit streams into p different interlaced and encoded bit streams, where p is an integer greater than or equal to m, p electro-optical modulators, respectively connected to the p outputs of the encoder, to modulate each of the p interlaced and encoded bit streams by means of p optical carriers with different wavelengths, a wavelength-division-multiplexer to combine the p optical carriers into a single optical signal suitable for being transmitted on an optical link.

The invention finally relates to a receiver of a binary data stream having an initial rate D and transmitted by the transmitter above, comprising, sequentially, a wavelength-division demultiplexer to demultiplex the received optical signal into p optical signals with different wavelengths delivered on p outputs of the demultiplexer, where p is an integer greater than one, p opto-electrical demodulators, connected respectively to the p outputs of the demultiplexer, to demodulate the p optical carriers and restore p bit streams, a decoder with p inputs and m outputs, the p inputs being connected to the p demodulators, where p is greater than or equal to m and m is an integer greater than one, in order to error-correcting decode the p bit streams and restore m decoded bit streams, a de-interleaver comprising m inputs, respectively connected to the m outputs of the decoder, and m outputs, to de-interleave the m decoded bit streams, m decoding modules respectively connected to the m outputs of the de-interleaver, each decoding module comprising successively and in reverse order to that of the transmission, a second decoder, followed by a de-interleaver, followed by a first decoder, each module being suitable for restoring a binary data stream at a rate D/m, a parallel/serial converter to restore the binary data stream with the initial rate D.

BRIEF DESCRIPTION OF THE DRAWINGS

Other characteristics and advantages of the invention will be clearly explained in the description which follows, given as a purely illustrative and non-limiting example, with reference to the attached schematic drawings, in which:

FIG. 6 shows a synoptic diagram of an example of a receiver, according to the invention;

FIG. 7 shows a synoptic diagram of an example of a channel-decoding module which can be included in the receiver, according to the invention.

DETAILED DESCRIPTION

Figure 1:
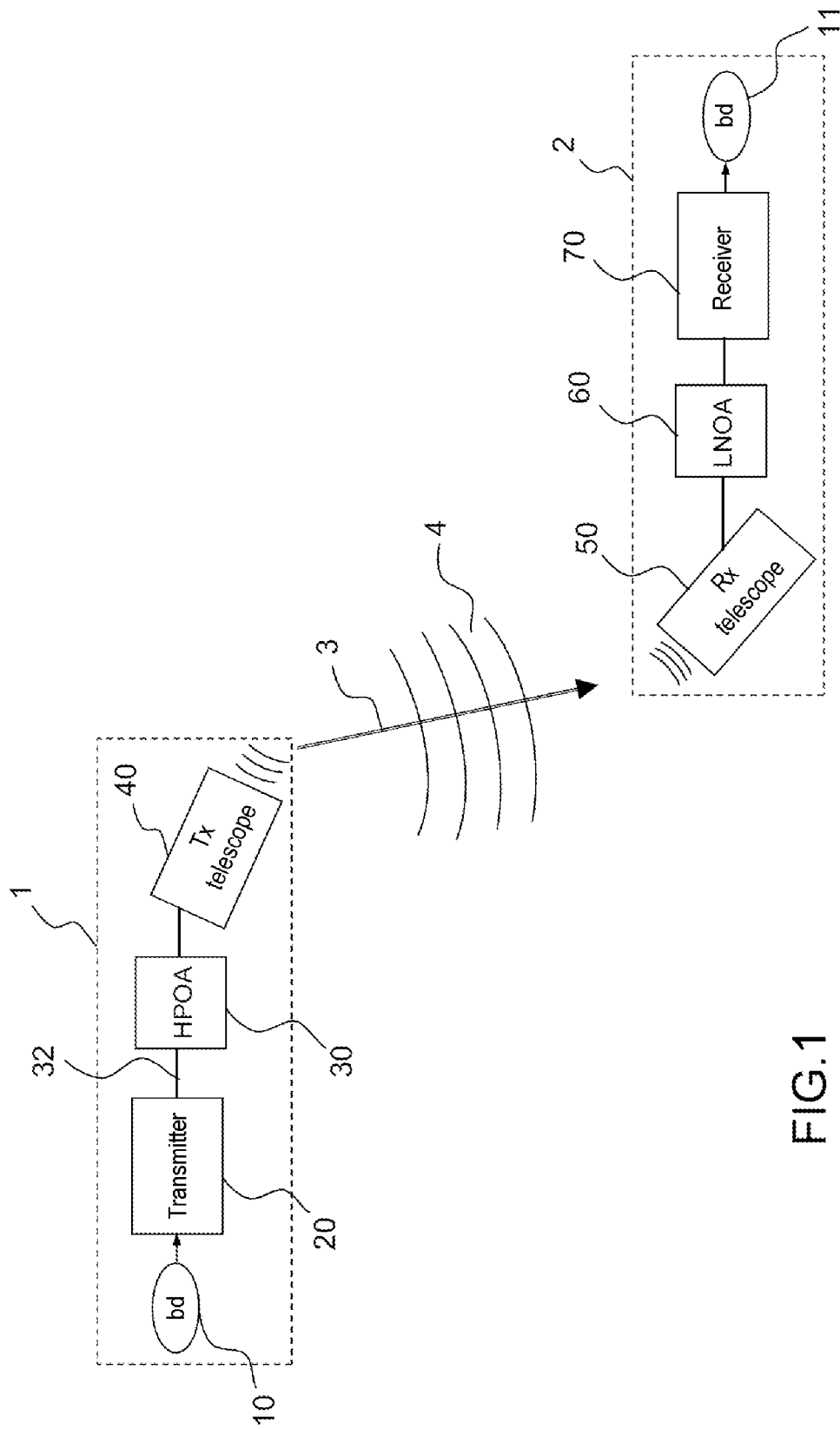
FIG. 1 shows a synoptic diagram of an example of a system for the transmission of a binary data stream by means of an optical signal, according to the invention.

As shown in the diagram in FIG. 1, according to the invention, the system for transmitting a binary data stream comprises, on transmission, connected in series, a binary data source 10, a transmitter 20 comprising means for encoding and demodulating a binary data stream incoming via a plurality of optical carriers modulated at different wavelengths, an optical power amplification chain 30 and a first telescope 40 suitable for transmitting an optical signal 3 made up of the modulated optical carriers at different wavelengths. On reception, the binary data transmission system comprises a second telescope 50 suitable for receiving the optical signal transmitted by the first telescope 40, a low-noise amplification chain 60, a receiver 70 comprising demodulation and decoding means suitable for reconstructing the binary data stream 11. The binary data source 10 may, for example, be made up of an imager or a data recorder. In the case of a system for transmitting a binary data stream between a satellite and an earth station 2, the transmitter 20, the optical power amplification chain 30 and the first telescope 40 may, for example, be located on-board the satellite 1 and the second telescope 50, the low-noise amplification chain 60 and the receiver 70 on-board the earth station, or vice versa.

The optical signal 3 transmitted by the first telescope 40 passes through atmospheric turbulence responsible for periods of attenuation of the power of the optical signal received by the second telescope 50.

So that the link between the satellite and the earth station is compatible with the high transmission rates of between several tens and several hundreds of Gbps, the invention consists in using the infrared transmission band around the 1550 nm (nanometer) wavelength.

The 1550 nm technology allows the transmission rates to be increased by exploiting, on the one hand, advantageous optical modulation formats and high rates initially developed for terrestrial telecommunications, and, on the other hand, the possibilities offered by optical power amplification on transmission and optical pre-amplification on reception, and finally the use of wavelength division multiplexing (WDM) allowing the total transmission rate to be increased substantially by using a large number of optical channels, each transporting a part of the information to be transmitted.

In order to make the digital electronics technologies compatible with both the long fading periods of the optical signal and the required high rates, the invention consists, on transmission, in transmitting the digital data by multiplexing them on a plurality of optical carriers modulated at a lower rate than the initial rate of the incoming stream. For example, a 40 Gbps link may be made up of 32 links at 1.25 Gbps. According to the invention, the digital data transmitted by each optical carrier are previously encoded and interleaved at a reduced rate, for example 1.25 Gbps. Furthermore, according to the invention, an encoding and interleaving between the data transmitted on the different wavelengths can possibly be added to improve the resistance of the link to scintillation. In fact, the effects of scintillation vary substantially according to the wavelength used. Thus, the data modulated by some carriers may be less affected and may comprise fewer or no errors, which, following demodulation, de-interleaving and decoding, allows all the data bits erased by scintillation to be more reliably reconstructed.

Figure 2:
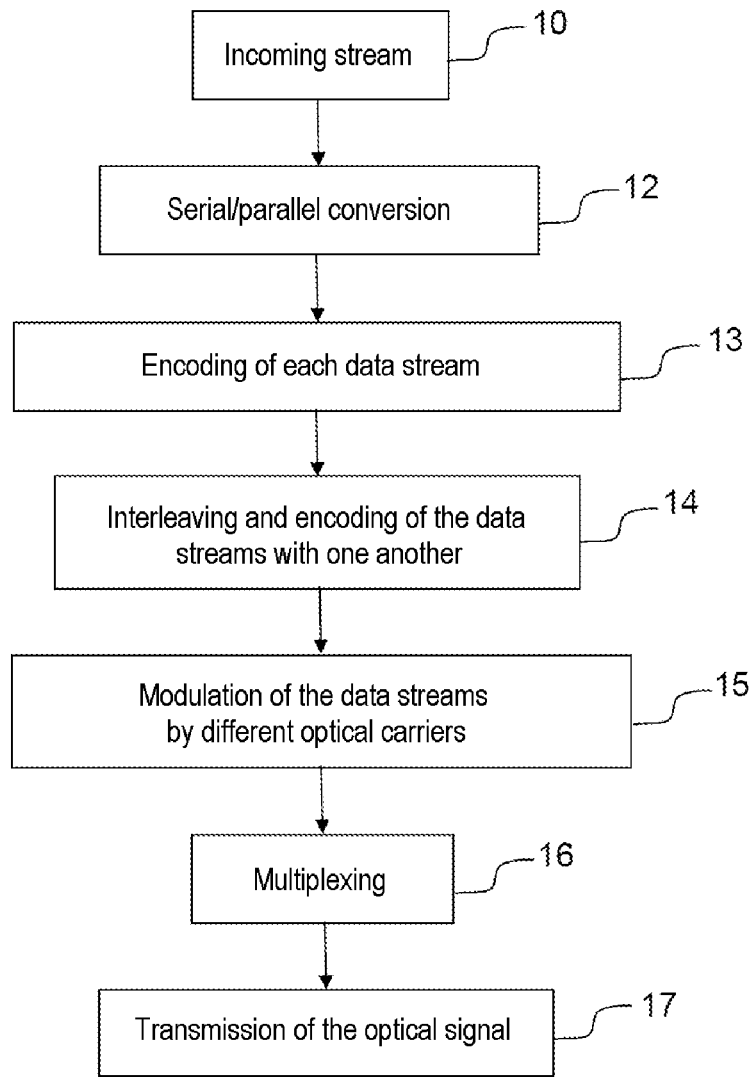
FIG. 2 shows a synoptic diagram of an example of a method for the transmission of a binary data stream by means of an optical signal, according to the invention.
Figure 3:
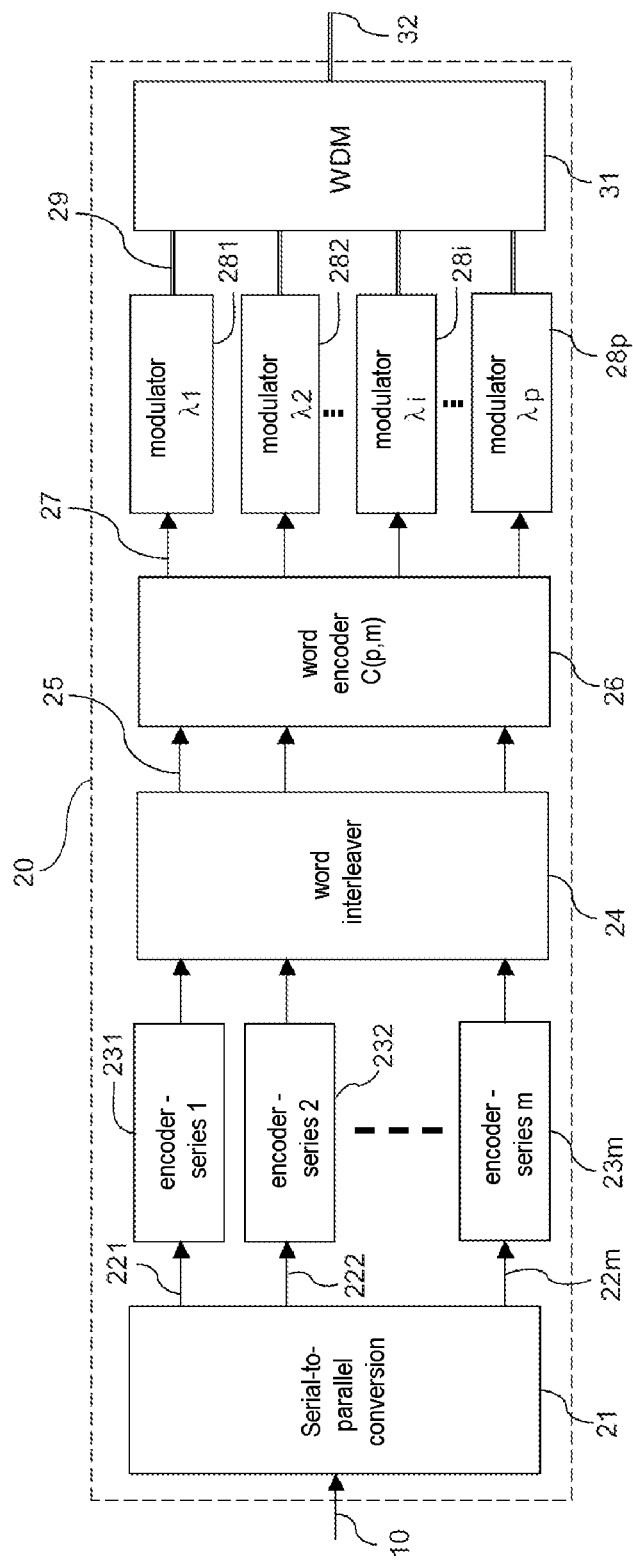
FIG. 3 shows a synoptic diagram of an example of a transmitter of a binary data stream, according to the invention.

To do this, as shown in FIGS. 2 and 3, the transmitter receives at its input a high-rate binary data stream 10 and transmits at its output, on a single optical fibre 32, an optical signal 3 made up of a plurality of modulated optical carriers at different wavelengths $\lambda 1, \lambda 2, \ldots, \lambda i, \ldots, \lambda p$. The binary data of the incoming stream 10 may be applied in series at the input of the transmitter or in parallel on a plurality of different receiver input channels. When the incoming flow 10 is made up of binary data in series, the method according to the invention comprises, on transmission, a first preliminary step 12 consisting in splitting the incoming stream at a high rate D into m different parallel bit streams, each bit stream having a rate D/m, m times lower than the rate of the incoming stream, where m is an integer greater than 1, each bit stream containing a part of the information to be transmitted. Thus, each of the m bit streams contains sequences of information bits sampled from the binary data stream 10, the sampled sequences being different from one bit stream to another bit stream. For this purpose, the transmitter 20 optionally comprises a serial-to-parallel converter 21, for example a multiplexer, comprising an input connected to the incoming binary data stream and comprising m outputs delivering respectively the m bit streams 221, 222, . . . , 22m.

In a second step 13, each of the m bit streams 221, 222, . . . , 22m applied on each channel is individually encoded by an error-correcting encoding adapted to each bit stream. A first encoding is implemented in parallel on each channel for each bit stream, the bit streams being considered independently from one another, by m dedicated first encoding modules 231, 232, 23m.

Then, in a third step 14, all of the bit streams, one bit stream thus being referred to as a "word", are interleaved with one another. The m encoded bit streams are interleaved in the same interleaver 24 with m inputs and m outputs in order to mix the data bits originating from different first encoding modules 231, 232 23m and to form m different interleaved bit streams 25. The interleaving of the m bit streams enables the separation and distribution, over a plurality of different channels, of the consecutive data bits located on the same channel before the interleaving. Thus, at the output of the interleaver 24, each channel comprises bit sequences originating from different first encoding modules, the bit sequences being able to be sampled in a fixed sequence or in a random sequence. In order to further increase resistance to scintillation, each of the m interleaved bit streams 25 can then be subjected to a second encoding in a second encoder C(p, m) 26 with m inputs and p outputs, where p is an integer greater than or equal to m.

Then, in a fourth step 15, each of the p interleaved and encoded bit streams 27 is modulated in p different electro-optical modulators 281, 282, . . . 28i, . . . , 28p, by means of p optical carriers with different wavelengths $\lambda 1, \lambda 2, \ldots, \lambda i, \ldots, \lambda p$, in order to obtain p different modulated optical signals 29 comprising information sequences taken in a random order and originating from all of the bit streams of the incoming binary data stream. Each optical carrier $\lambda i$, where i is between 1 and p, originates from an optical source with a wavelength $\lambda i$. The p optical signals flowing on the respective p channels are modulated by optical carriers having different wavelengths.

Figure 4:
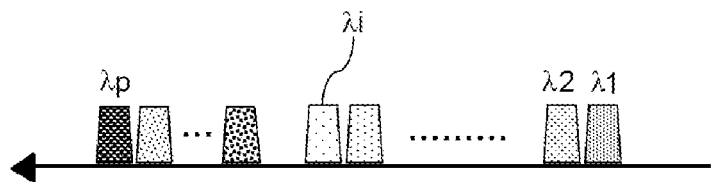
FIG. 4 shows a diagram of an example of the spectrum of an optical signal made up of a plurality of p optical carriers with different wavelengths, according to the invention.

In a fifth step 16, the p optical signals 29 are then wavelength-division-multiplexed in a multiplexer 31 in order to obtain a multiplexed optical signal 3 suitable for being transmitted, in a step 17, on the optical fibre 32 connected at the output of the transmitter 20. FIG. 4 shows a diagram of an example of the spectrum of the optical signal 3 made up of a plurality of optical carriers of different wavelengths $\lambda 1, \lambda 2, \ldots, \lambda i, \ldots, \lambda p$.

Figure 5A:
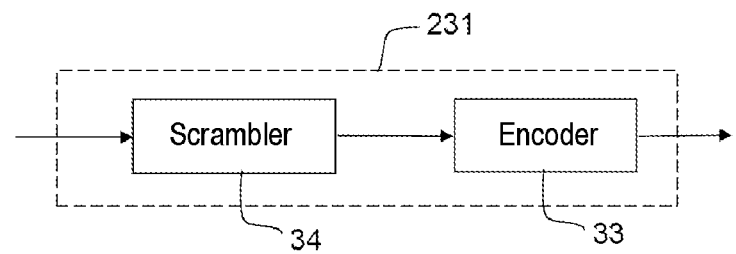
FIGS. 5a to 5d show synoptic diagrams showing four different examples of a channel-encoding module which can be included in the transmitter, according to the invention.

As shown schematically in the synoptic diagrams of the alternative embodiments in FIGS. 5a, 5b, 5c, 5d, the first encoding module 231, 232, . . . , 23m of each channel may comprise only one encoder 33 or a plurality of series-connected encoding and interleaving modules. Any encoding adds redundancy to the binary data bits. Furthermore, a scrambler 34 can be connected upstream of the encoder 33. In a first alternative embodiment, as shown in FIG. 5a, on each channel, the first encoding module 231, 232, 23m may advantageously comprise a scrambler 34 and an encoder 33 connected at the output of the scrambler 34. The role of the scrambler is to multiply bit-by-bit the binary data stream by a pseudo-random binary sequence in order to prevent the binary data stream transmitted to the encoder 33 from comprising long sequences of consecutive identical 0 or 1 bits. In fact, an encoder could malfunction if it receives long sequences of consecutive identical bits.

Figure 5B:
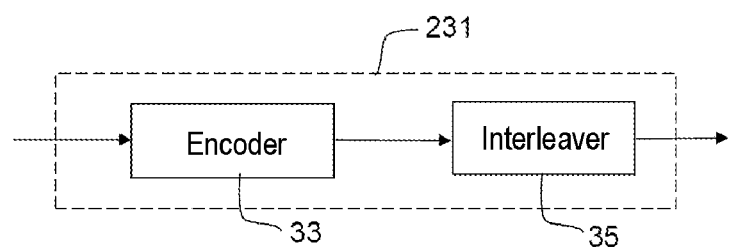

Alternatively, as shown in FIG. 5b, the first encoding module 231, 232, 23m may comprise an encoder 33 associated with a channel interleaver 35. The channel interleaver 35, placed at the output of the encoder 33, is intended to ensure an interleaving of the data bits of the encoded binary data stream.

Figure 5C:
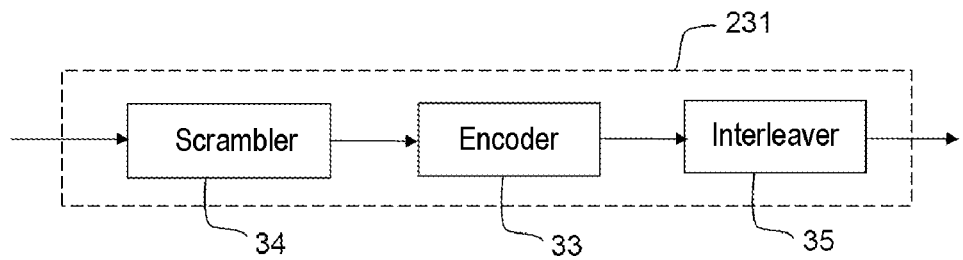

Alternatively, as shown in FIG. 5c, the first encoding module 231, 232, 23m may comprise, sequentially, a scrambler 34, and encoder 33 and an interleaver 35.

Figure 5D:
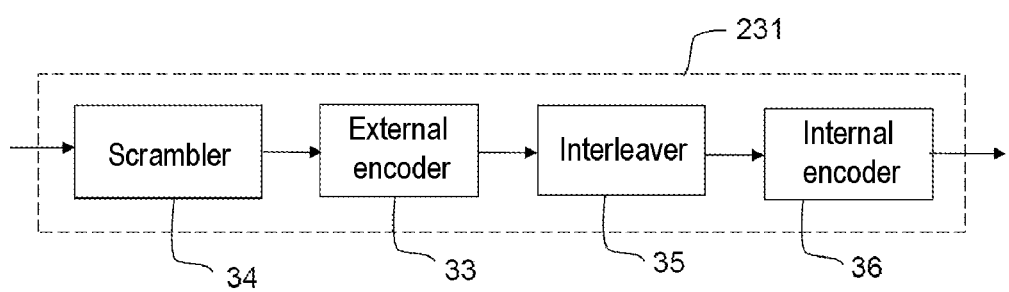

Finally, in a preferred alternative embodiment of the invention, as shown in FIG. 5d, the first encoding module 231, 232, 23m may comprise, sequentially, a first encoder 33, also referred to as an external encoder, intended to apply a first encoding to the binary data stream leaving the scrambler, an interleaver 35 and a second encoder 36, also referred to as an internal encoder, intended to apply a second encoding following interleaving of the data bits of the bit stream transmitted on the channel. Furthermore, a scrambler 34 may be added upstream of the first encoder 33, as shown in FIGS. 5a and 5c. The first encoding adds redundancy bits to the data bits, the interleaver mixes the data bits and redundancy bits and the second encoding adds additional redundancy bits.

Any type of known error-correcting encoding method can be used, such as, for example, a Reed-Solomon code, or a Hamming code, or a BCH code (Bose, Ray-Chaudhuri and Hocquenghem), or an LPDC code (Low Parity Density Code), or a turbocode. The first individual encodings of the bit streams implemented in step 13 may advantageously be of different types from one bit stream to the other.

As shown in the diagram in FIG. 6, the receiver 70 receives at its input, on an optical fibre 61, the optical signal 3, transmitted by the transmitter 20, made up of a plurality of p optical carriers modulated at different wavelengths, and transmits at its output the high-rate demodulated and decoded binary data stream transmitted by the binary data source 10. During the transmission, the optical signal 3 has passed through atmospheric turbulence 4 and comprises transmission errors. The receiver comprises demultiplexing, demodulation, decoding and de-interleaving modules corresponding to the multiplexing, modulation, encoding and interleaving modules of the transmitter 20 and carrying out the reverse operations in order to restore the high-rate binary data stream transmitted by the source 10. The codes used for the decoding of the data are identical to the codes used for the encoding.

Thus, the receiver comprises a wavelength-division demultiplexer 62 to demultiplex the optical signal received in p optical signals of different wavelengths $\lambda 1, \lambda 2, \ldots, \lambda i, \ldots, \lambda p$ delivered on p outputs of the demultiplexer. The p outputs of the demultiplexer 62 are respectively connected to p opto-electrical demodulators 63, each demodulator 63 being suitable for demodulating one of the optical carriers $\lambda i$ and for restoring a bit stream. The p demodulators 63 are connected to a decoder C(p, m) 64 comprising p inputs suitable for receiving the p demodulated bit streams and m outputs. The decoder C(p, m) 64 is suitable for delivering decoded bit streams on the m outputs. The m outputs of the decoder m C(p, m) 64 are connected to m inputs of a bit stream de-interleaver 65. The de-interleaver 65 is suitable for delivering m de-interleaved bit streams on its m outputs. Each of the m bit streams is then decoded separately, in different channels, by a dedicated decoding module 661, 662, ..., 66m suitable for delivering a bit stream at a rate D/m. The m bit streams at the rate D/m can then be processed in a parallel/serial converter 67 in order to restore a binary data stream in series at a rate D.

As shown in FIG. 7, each decoding module 661, 662, ..., 66m dedicated to each channel may comprise a single decoder 71 or an internal decoder 71 and an external decoder 73 separated by a de-interleaver 72. Furthermore, the decoder module may comprise a descrambler 74.

Although the invention has been described in connection with particular embodiments, it is obvious that it is in no way limited thereto and that it includes all the technical equivalents of the means described and also their combinations if they fall within the scope of the invention.

The invention claimed is:

1. A method for transmitting a binary data stream having a predetermined initial rate D, comprising, sequentially:
   in a first preliminary step, splitting the binary data stream into m different bit streams at a rate which is m times lower than the initial rate D, where m is an integer greater than 1, the m bit streams containing different information bit sequences,
   in a second step, implementing a first individual error-correcting encoding of each of the m bit streams, the first individual error-correcting encoding of each bit stream comprising successively a first encoding, followed by an interleaving, followed by a second encoding,
   in a third step, time-interleaving the m encoded bit streams with one another in order to mix the information bits originating from different encoded bit streams, and in implementing an error-correcting encoding of the m interleaved bit streams into p different interleaved and encoded bit streams, where p is an integer greater than or equal to m,
   in a fourth step, modulating each of the p interleaved and encoded bit streams by means of p optical carriers with different wavelengths in order to obtain p different optical signals,
   in a fifth step, wavelength-division-multiplexing the p optical signals in order to obtain a multiplexed optical signal, and
   in a sixth step, transmitting on a optical link the multiplexed optical signal.

2. The method for receiving a binary data stream transmitted by the transmission method according to claim 1, comprising, sequentially, wavelength-division-demultiplexing a received optical signal in order to restore p optical carriers with different wavelengths, demodulating each of the p optical carriers in order to restore p interlaced and encoded bit streams, de-interleaving and error-correcting decoding the p bit streams in order to restore m encoded bit streams, and individually error-correcting decoding each of the m bit streams in order to restore m different bit streams at a rate D/m, and converting the m bit streams into a binary data stream corresponding to the transmitted binary data stream.

3. A transmitter of a binary data stream having a predetermined initial rate D, comprising, sequentially:
   a serial/parallel converter to split the binary data stream into m different parallel bit streams, each bit stream having a rate D/m which is m times lower than the initial rate D, where m is an integer greater than 1,
   m first encoding modules dedicated to each bit stream in order to error-correcting encode individually each bit stream, each first encoding module comprising successively a first encoder, followed by an interleaver, followed by a second encoder,
   a time-interleaver with m inputs and m outputs to intermix the information bits originating from the different individually encoded bit streams,
   an encoder with m inputs and p outputs to error-correcting encode the m interlaced bit streams into p different interlaced and encoded bit streams, where p is an integer greater than or equal to m,
   p electro-optical modulators, respectively connected to the p outputs of the encoder, to modulate each of the p interlaced and encoded bit streams by means of p optical carriers with different wavelengths, and a wavelength-division-multiplexer to combine the p optical carriers into a single optical signal transmitted on an optical link.

4. A receiver of a binary data stream having an initial rate D and transmitted by the transmitter according to claim 3, comprising, sequentially:
- a wavelength-division demultiplexer to demultiplex the received optical signal into p optical signals with different wavelengths delivered on p outputs of the demultiplexer, where p is an integer greater than one,
- p opto-electrical demodulators, connected respectively to the p outputs of the demultiplexer, to demodulate the p optical carriers and restore p bit streams,
- a decoder with p inputs and m outputs, the p inputs being connected to the p demodulators, where p is greater than or equal to m and m is an integer greater than one, in order to error-correcting decode the p bit streams and restore m decoded bit streams,
- a de-interleaver comprising m inputs, respectively connected to the m outputs of the decoder, and m outputs, to de-interleave the m decoded bit streams,
- m decoding modules respectively connected to the m outputs of the de-interleaver, each decoding module comprising successively and in reverse order to that of the transmission, a second decoder, followed by a de-interleaver, followed by a first decoder, each module for restoring a binary data stream at a rate D/m, and
- a parallel/serial converter to restore the binary data stream at the initial rate D.

\* \* \* \* \*